US010134470B2

(12) United States Patent
Tortorelli et al.

(10) Patent No.: US 10,134,470 B2
(45) Date of Patent: Nov. 20, 2018

(54) APPARATUSES AND METHODS INCLUDING MEMORY AND OPERATION OF SAME

(71) Applicant: Micron Technology, Inc., Boise, ID (US)

(72) Inventors: Innocenzo Tortorelli, Cernusco sul Naviglio (IT); Stephen Tang, Fremont, CA (US); Christina Papagianni, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/932,746

(22) Filed: Nov. 4, 2015

(65) Prior Publication Data

US 2017/0125097 A1    May 4, 2017

(51) Int. Cl.
*G11C 11/00* (2006.01)
*G11C 13/00* (2006.01)
*G11C 11/56* (2006.01)

(52) U.S. Cl.
CPC ...... *G11C 13/0069* (2013.01); *G11C 11/5678* (2013.01); *G11C 13/004* (2013.01); *G11C 13/0004* (2013.01); *G11C 2013/005* (2013.01); *G11C 2013/0052* (2013.01); *G11C 2013/0073* (2013.01); *G11C 2213/76* (2013.01); *G11C 2213/77* (2013.01)

(58) Field of Classification Search
CPC ............ G11C 13/0004; G11C 13/0069; G11C 11/5678; G11C 2213/71
USPC ................................................. 365/163, 148
See application file for complete search history.

(56) References Cited

U.S. PATENT DOCUMENTS

| 7,106,625 | B2 | 9/2006 | Yeh |
| 7,200,045 | B2 | 4/2007 | Lue |
| 7,289,359 | B2 | 10/2007 | Kuo et al. |
| 7,324,377 | B2 | 1/2008 | Lee |
| 7,394,680 | B2* | 7/2008 | Toda ............ G11C 13/0004 365/148 |
| 7,515,461 | B2 | 4/2009 | Happ et al. |
| 8,077,505 | B2 | 12/2011 | Chen et al. |

(Continued)

FOREIGN PATENT DOCUMENTS

| CN | 104871313 A | 8/2015 |
| TW | 201145279 A | 12/2011 |

(Continued)

OTHER PUBLICATIONS

ISR/WO dated Feb. 3, 2017 for appln No. PCT/US2016/058714.

(Continued)

*Primary Examiner* — Huan Hoang
(74) *Attorney, Agent, or Firm* — Dorsey & Whitney LLP

(57) ABSTRACT

Disclosed herein is a memory cell. The memory cell may act both as a combined selector device and memory element. The memory cell may be programmed by applying write pulses having different polarities. Different polarities of the write pulses may program different logic states into the memory cell. The memory cell may be read by read pulses all having the same polarity. The logic state of the memory cell may be detected by observing different threshold voltages when the read pulses are applied. The different threshold voltages may be responsive to the different polarities of the write pulses.

12 Claims, 15 Drawing Sheets

(56) References Cited

U.S. PATENT DOCUMENTS

| | | | |
|---|---|---|---|
| 8,111,541 B2 | 2/2012 | Lai et al. | |
| 8,450,713 B2 | 5/2013 | Awaya et al. | |
| 8,729,523 B2 | 5/2014 | Pio | |
| 8,841,649 B2 | 9/2014 | Pio | |
| 9,728,584 B2 | 8/2017 | Ramaswamy et al. | |
| 9,799,381 B1 | 10/2017 | Tortorelli et al. | |
| 9,805,794 B1 | 10/2017 | Li et al. | |
| 2004/0042259 A1* | 3/2004 | Campbell | G11C 13/0004 365/158 |
| 2004/0062071 A1 | 4/2004 | Rodriguez et al. | |
| 2007/0047300 A1 | 3/2007 | Lee et al. | |
| 2008/0112211 A1 | 5/2008 | Toda | |
| 2008/0205147 A1 | 8/2008 | Santin et al. | |
| 2009/0020745 A1 | 1/2009 | Jeong et al. | |
| 2009/0034325 A1* | 2/2009 | Lowrey | G11C 13/0004 365/163 |
| 2009/0109737 A1 | 4/2009 | Kostylev | |
| 2009/0154222 A1 | 6/2009 | Chien et al. | |
| 2009/0201740 A1 | 8/2009 | Willer et al. | |
| 2009/0279350 A1 | 11/2009 | Chen et al. | |
| 2010/0020606 A1 | 1/2010 | Yamada | |
| 2010/0067291 A1* | 3/2010 | Fuji | G11C 13/0004 365/163 |
| 2010/0208508 A1 | 8/2010 | Baek et al. | |
| 2010/0226163 A1* | 9/2010 | Savransky | G11C 13/0004 365/148 |
| 2010/0264211 A1 | 11/2010 | Hennessey | |
| 2011/0294290 A1 | 12/2011 | Nakanishi et al. | |
| 2011/0316063 A1 | 12/2011 | Tang et al. | |
| 2012/0327708 A1 | 12/2012 | Du et al. | |
| 2013/0026438 A1 | 1/2013 | Wang et al. | |
| 2013/0044534 A1* | 2/2013 | Kawai | G11C 13/0007 365/148 |
| 2013/0078776 A1 | 3/2013 | Kim et al. | |
| 2013/0094275 A1 | 4/2013 | Chen | |
| 2013/0200326 A1 | 8/2013 | Ju et al. | |
| 2013/0229846 A1 | 9/2013 | Chien et al. | |
| 2013/0322167 A1 | 12/2013 | Krebs | |
| 2014/0043911 A1 | 2/2014 | Samachisa et al. | |
| 2014/0061574 A1 | 3/2014 | Pio | |
| 2014/0061577 A1 | 3/2014 | Kanno et al. | |
| 2014/0063898 A1 | 3/2014 | Fantini et al. | |
| 2014/0077142 A1 | 3/2014 | Choi | |
| 2014/0131653 A1 | 5/2014 | Lee et al. | |
| 2014/0192585 A1* | 7/2014 | Hashim | H01L 45/08 365/148 |
| 2014/0217349 A1 | 8/2014 | Hopkins | |
| 2015/0187416 A1 | 7/2015 | Bedeschi | |
| 2015/0243336 A1 | 8/2015 | Karpov et al. | |
| 2015/0287460 A1* | 10/2015 | Lee | G11C 13/0069 365/148 |
| 2015/0311031 A1 | 10/2015 | Platzgummer et al. | |
| 2015/0311256 A1 | 10/2015 | Rabkin et al. | |
| 2016/0126455 A1 | 5/2016 | Hayashi et al. | |
| 2016/0133319 A1 | 5/2016 | Fantini et al. | |
| 2016/0225459 A1 | 8/2016 | Boysan et al. | |
| 2016/0240249 A1 | 8/2016 | Kellam et al. | |
| 2016/0336066 A1 | 11/2016 | Lin et al. | |
| 2017/0125484 A1 | 5/2017 | Pellizzer et al. | |
| 2018/0040370 A1 | 2/2018 | Tortorelli et al. | |

FOREIGN PATENT DOCUMENTS

| | | |
|---|---|---|
| TW | 201212318 A | 3/2012 |
| TW | 201515197 A | 4/2015 |
| WO | 2017078932 A1 | 5/2017 |
| WO | 20180031217 A1 | 2/2018 |

OTHER PUBLICATIONS

Chen, et al., "An Access-Transistor-Free (0T/1R) Non-Volatile Resistance Random Access Memory (RRAM) Using a Novel Threshold Switching, Self-Rectifying Chalcogenide Device", Electron Devices Meeting, 2003. IEDM '03 Technical Digest. IEEE International; 4 pages.

Office Action date Mar. 26, 2018 for Taiwanese Application No. 105136005.

U.S. Appl. No. 15/854,656, entitled 'Three-Dimensional Memory Apparatuses and Methods of Use', filed Dec. 26, 2017.

U.S. Appl. No. 15/855,958, entitled 'Three-Dimensional Memory Apparatus and Method of Manufacturing the Same', filed Dec. 27, 2017.

U.S. Appl. No. 15/841,118 entitled "Apparatuses Including Memory Cells and Methods of Operation of Same" filed Dec. 13, 2017.

* cited by examiner

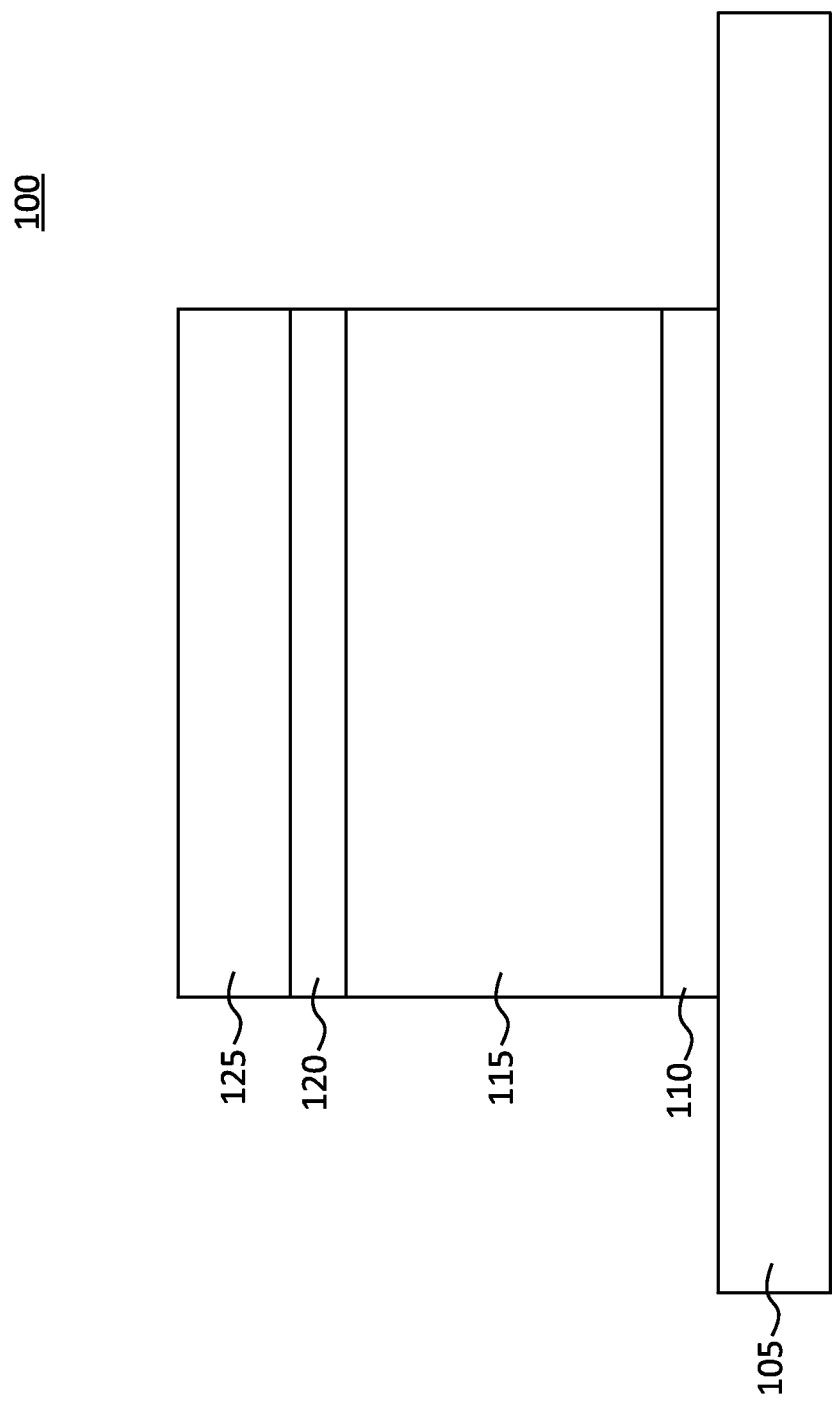

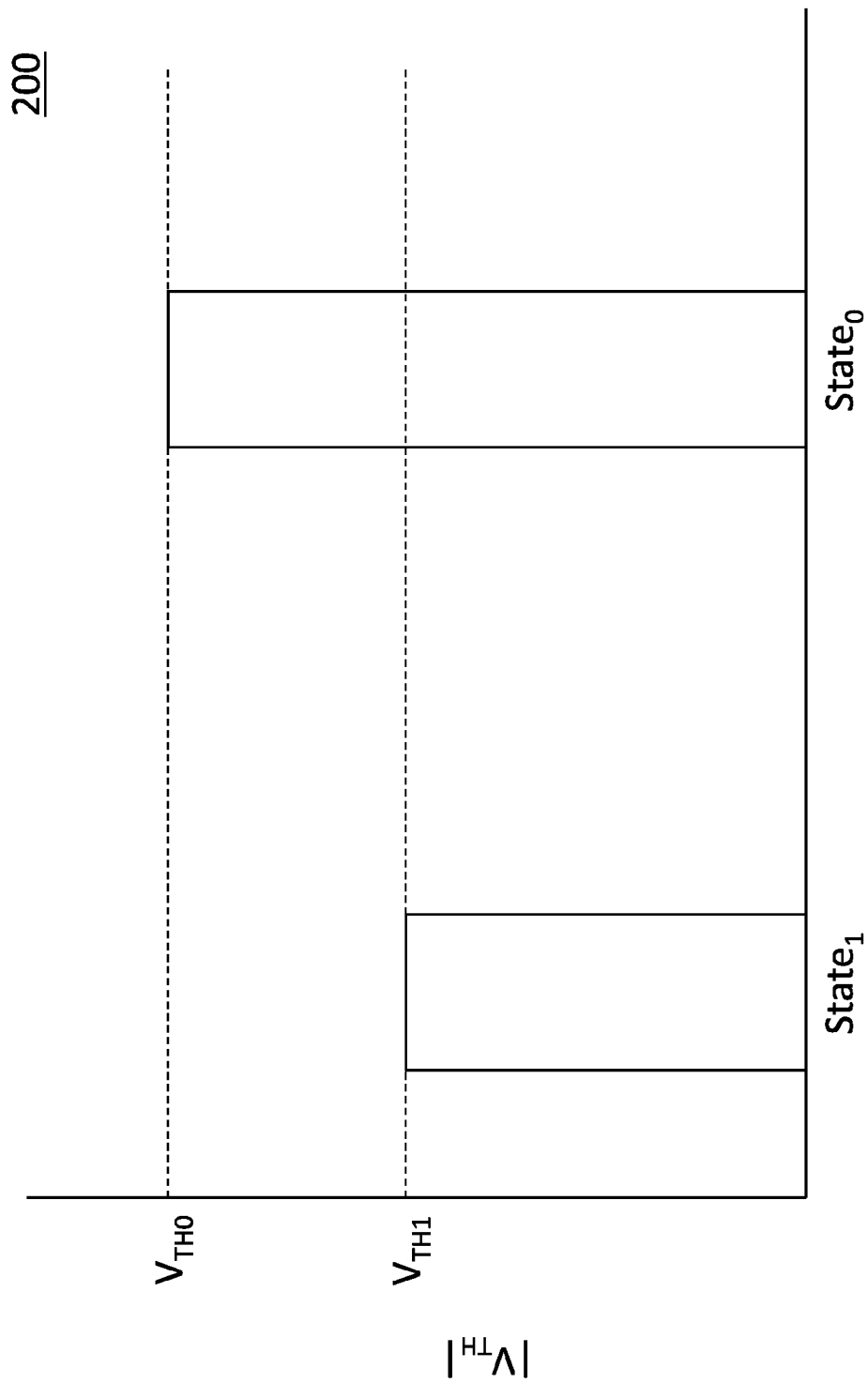

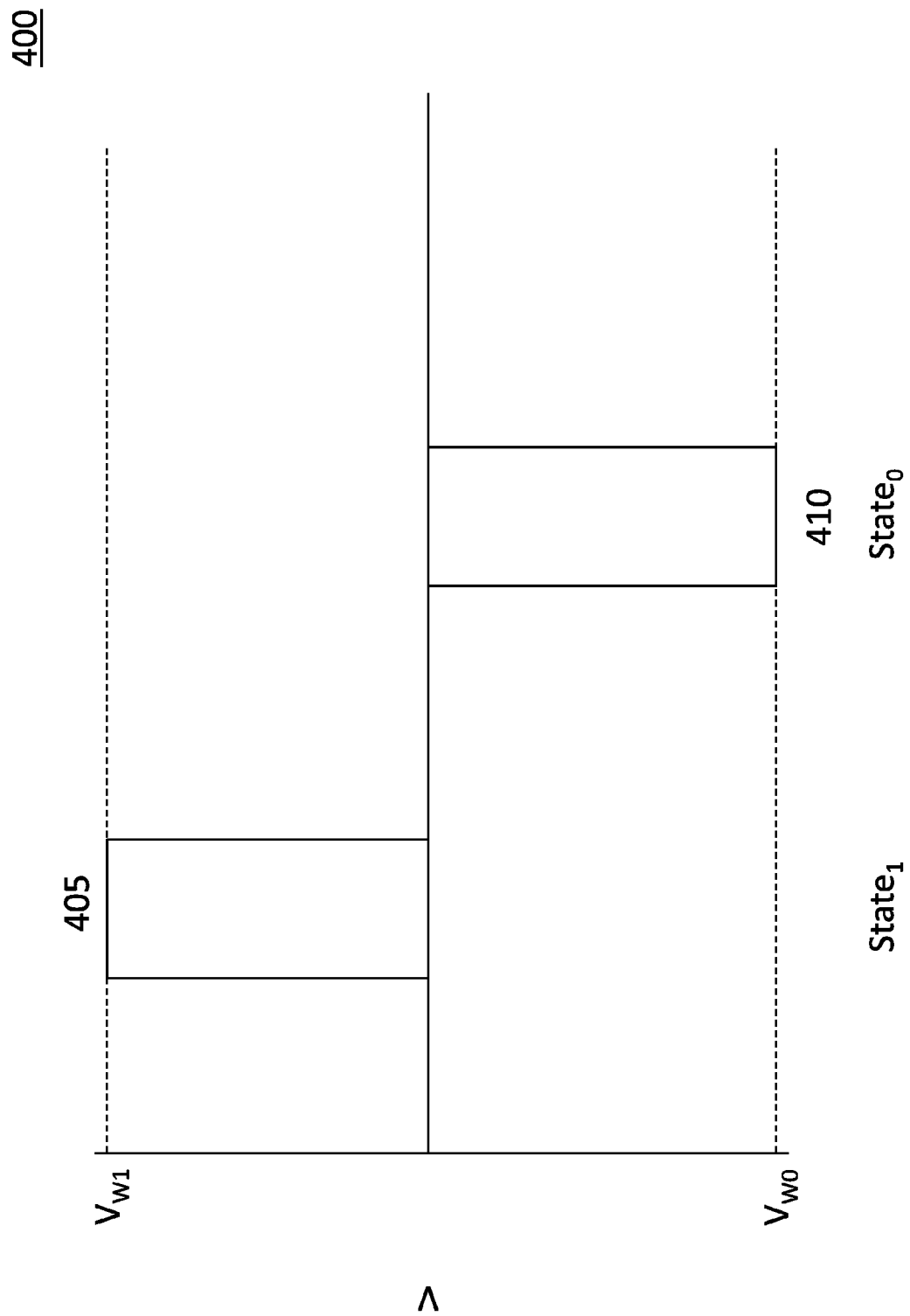

APPARATUSES AND METHODS INCLUDING MEMORY AND OPERATION OF SAME

BACKGROUND

Traditional memory cells include a memory element, which is used to store a logic state, and a selector device. The memory element and selector device may be located at a cross-point of a first signal line (e.g., word line) and a second signal line (e.g., bit line) in a memory array having a cross-point architecture. The selector may be coupled to the word line and the memory element may be coupled to the bit line in some architectures. The selector device may reduce leakage currents and allow selection of a single memory element for reading data and/or writing data. However, the use of separate memory elements and selector devices increases the number of materials and/or layers that must be formed during fabrication of the memory device, thus increasing the complexity of the structure and fabrication process. Moreover, activating the selector device and writing or reading the memory element may require high voltage and/or long duration pulses to be provided, which may increase power consumption of the memory device.

BRIEF DESCRIPTION OF THE DRAWINGS

FIG. 1 is an illustration of a portion of a memory array according to an embodiment of the disclosure.

FIG. 2 is a voltage plot of threshold voltages according to an embodiment of the disclosure.

FIG. 4 is a voltage plot of write pulse voltages according to an embodiment of the disclosure.

DETAILED DESCRIPTION

Figure 3A:
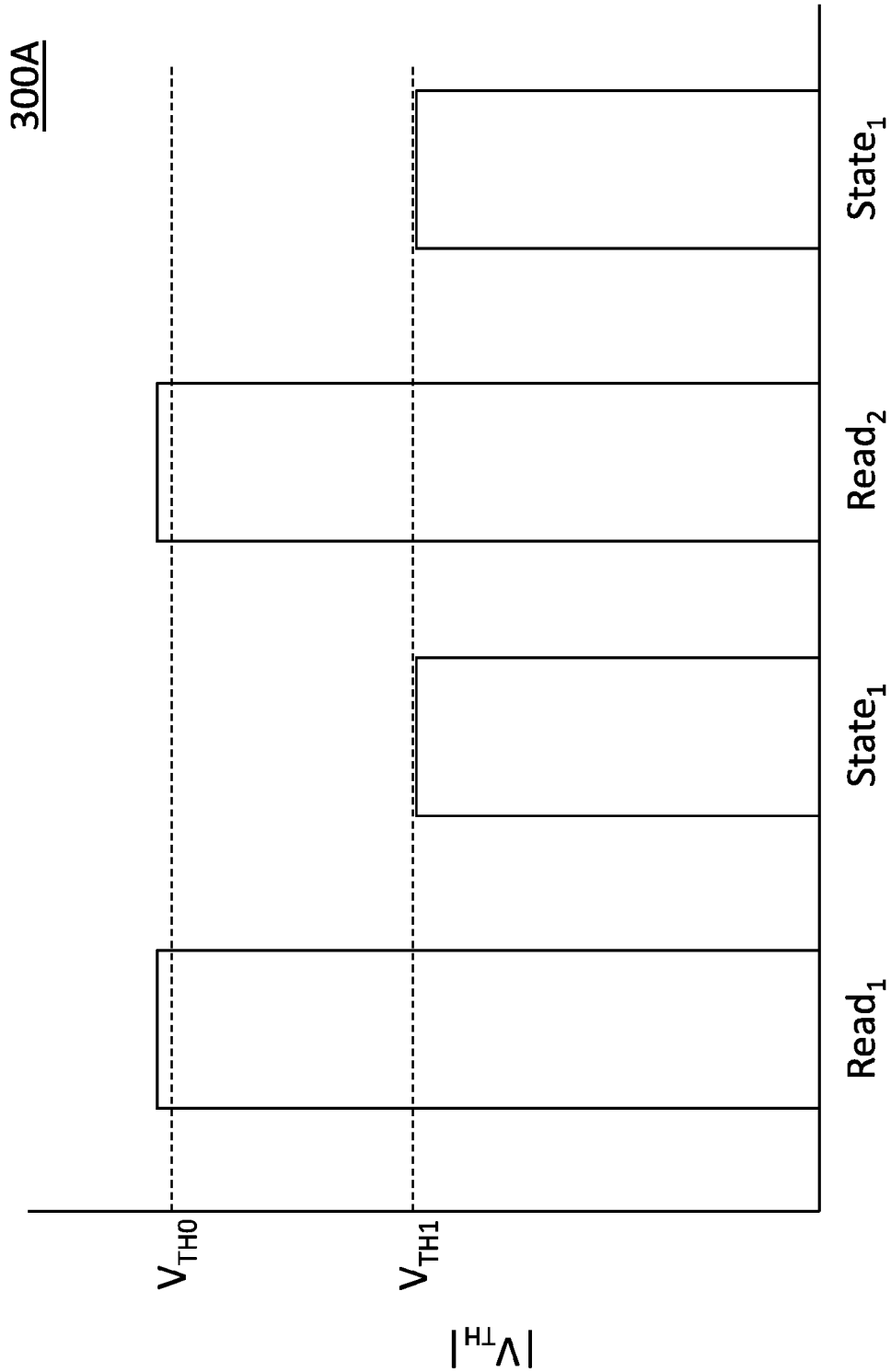
FIG. 3A is a voltage plot of threshold voltages and read pulse voltages according to an embodiment of the disclosure.

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

A memory array may be implemented that utilizes a memory cell that exhibits certain threshold voltage properties. By exhibit certain threshold voltage properties, it is meant that the memory cell may have or may appear to have a particular threshold voltage. The memory cell may or may not experience a threshold event when exhibiting the certain threshold voltage properties. The threshold voltage exhibited by the memory cell may depend on the relative voltage polarities of read and write pulses applied across the cell. For example, the memory cell may exhibit a first threshold voltage when read if the memory cell was written to and then read with the same voltage polarity. The memory cell may exhibit a second threshold voltage when read if the memory cell was written to and then read with different (e.g., opposite) voltage polarities. The threshold voltage properties of the memory cell may allow the memory cell to act as a selector device and a memory element. The memory cell may include a single layer of material between electrodes in some embodiments. Such a memory cell structure may facilitate a simplified architecture for a cross-point memory array and/or other memory architectures. The simplified architecture may require fewer layers, which may reduce processing steps during manufacture.

A logic state may be written to the memory cell, which may correspond to one or more bits of data. The memory cell may be written to by applying voltages of different polarities. The memory cell may be read by applying voltages of a single polarity. The writing and reading protocols may take advantage of different threshold voltages of the memory cell that result from the different polarities. The memory cell may require short, relatively low power pulses to read and write. In some embodiments, the memory cell may include a chalcogenide material. However, the chalcogenide material may or may not undergo a phase change during reading and/or writing. In some embodiments, the chalcogenide material may not be a phase change material. The memory cell may have less thermal disturb compared to traditional phase change memory architectures.

FIG. 1 is an illustration of a portion of a memory array 100 according to an embodiment of the disclosure. The memory array 100 may include a first access line 105 and a second access line 125. For ease of reference, the first access line may be referred to as a word line (WL) and the second access line may be referred to as a bit line (BL) 125. As shown in FIG. 1, the WL 105 is perpendicular to the BL 125. As shown in FIG. 1, WL 105 extends parallel to the page and BL 125 extends into the page. A memory cell 115 may be located at an intersection of the WL 105 and the BL 125. The memory cell 115 may be coupled to WL 105 by a first electrode 110 and coupled to BL 125 by a second electrode 120. The memory cell 115 may include a layer of phase change material. In some embodiments, the chalcogenide may be phase chance material. In some embodiments, the memory cell 115 may include a ternary composition that may include selenium (Se), arsenic (As), and germanium (Ge). In some embodiments, the memory cell 115 may include a quaternary composition that may include silicon (Si), Se, As, and Ge. Other materials may also be used. The memory cell 115 may act as both a selector device and a memory element.

The memory cell 115 may be written to store one of at least two different logic states (e.g., '1,' '0') by a write operation. In some embodiments, the different logic states may be represented by different threshold voltages ($V_{TH}$) of the memory cell 115. For example, a '1' logic state may be represented by a first $V_{TH}$ and a '0' logic state may be represented by a second $V_{TH}$. The threshold voltage the memory cell 115 exhibits may be based on a polarity of a write pulse applied to the memory cell 115 during a write operation and a polarity of a read pulse applied to the memory cell 115 during a read operation. The write pulse and read pulse may be applied to the memory cell 115 using the first and second access lines 105 and 125.

The memory cell 115 may be configured as a two-terminal device between the BL 125 and WL 105 in some embodiments. A first logic state may be written to the memory cell 115 by applying a voltage (e.g., a write pulse) across the memory cell 115 in a first polarity. A second logic state may be written to the memory cell 115 by applying a voltage (e.g., a write pulse) across the memory cell 115 in a second polarity, which may be opposite to the first polarity. The memory cell 115 is read by applying a voltage (e.g., a read pulse) across the terminals. In some embodiments, the memory cell 115 is read by applying a voltage across the memory cell 115 in the first polarity. In other embodiments, the memory cell 115 is read by applying a voltage across the memory cell 115 in the second polarity. The memory cell 115 may always be read with the same polarity. When the memory cell 115 is read with a voltage in the same voltage polarity with which the memory cell 115 was written, the memory cell 115 may exhibit a first $V_{TH}$. When the memory cell 115 is read with a voltage in the opposite voltage polarity with which the memory cell 115 was written, the memory cell may exhibit a second $V_{TH}$. The different threshold voltages may be used to represent different logic states.

When the memory cell 115 is a two-terminal device, the relative values of the voltages between the terminals determines the magnitude and the polarity of the voltage applied across the memory cell 115. For example, providing a voltage of 3V to the BL 125 and 0V to WL 105 results in the same magnitude and polarity of voltage as providing a voltage of 6V at BL 125 and 3V at WL 105. Other non-negative (e.g., 0V or greater), negative, and/or positive voltages may be provided to the memory access lines in some embodiments. As used herein, forward polarity indicates that the BL 125 is set at a higher voltage than the WL 105 and reverse polarity indicates that the BL 125 is set at a lower voltage than the WL 105. However, the use of "forward" and "reverse" polarities is by way of example, and the embodiments of the invention are not limited to those of the particular polarity direction described herein.

FIG. 2 is a voltage plot 200 of threshold voltages $V_{TH1}$, $V_{TH0}$ for two logic states State$_1$, State$_0$ of a memory cell according to an embodiment of the disclosure. The threshold voltages of the memory cell are the threshold voltages observed when the memory cell is read. The memory cell may be read using a read voltage in the same polarity each time it is read, for example, in forward polarity. $V_{TH1}$ may be observed in the memory cell when the memory cell was written to in the same polarity as the read voltage. This may correspond to logic State$_1$. For example, the memory cell may have been written to in a forward polarity and is then read in forward polarity. Conversely, $V_{TH0}$ may be observed in the memory cell when the memory cell was written to in the opposite polarity as the read voltage. For example, the memory cell may have been written to in a reverse polarity and is then read in a forward polarity. As illustrated by FIG. 2, in some embodiments, different threshold voltages may be observed for the memory cell written and read in opposite polarities in comparison to the memory cell written and read in the same polarity.

Figure 3B:
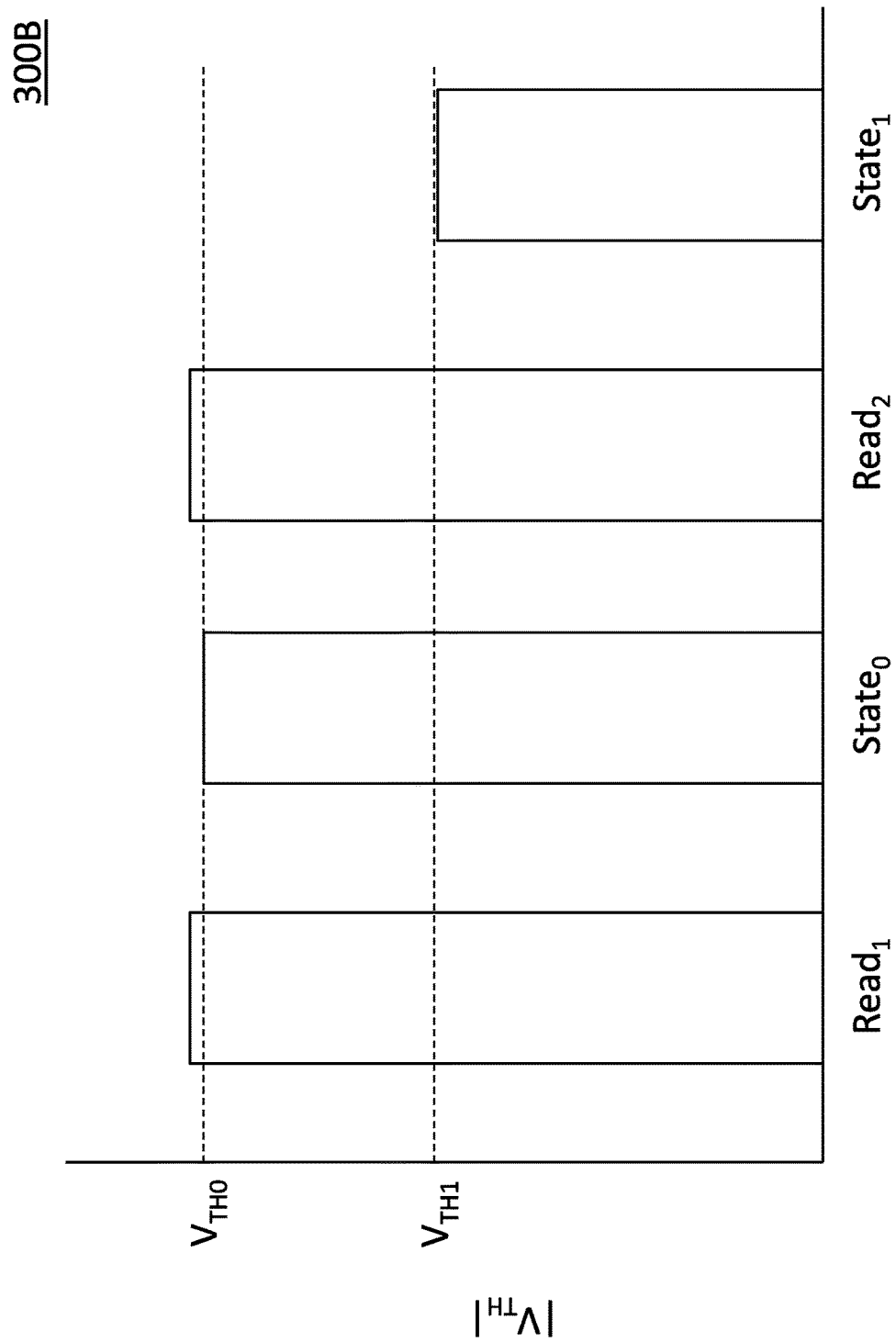
FIG. 3B is a voltage plot of threshold voltages and read pulse voltages according to an embodiment of the disclosure.
Figure 3C:
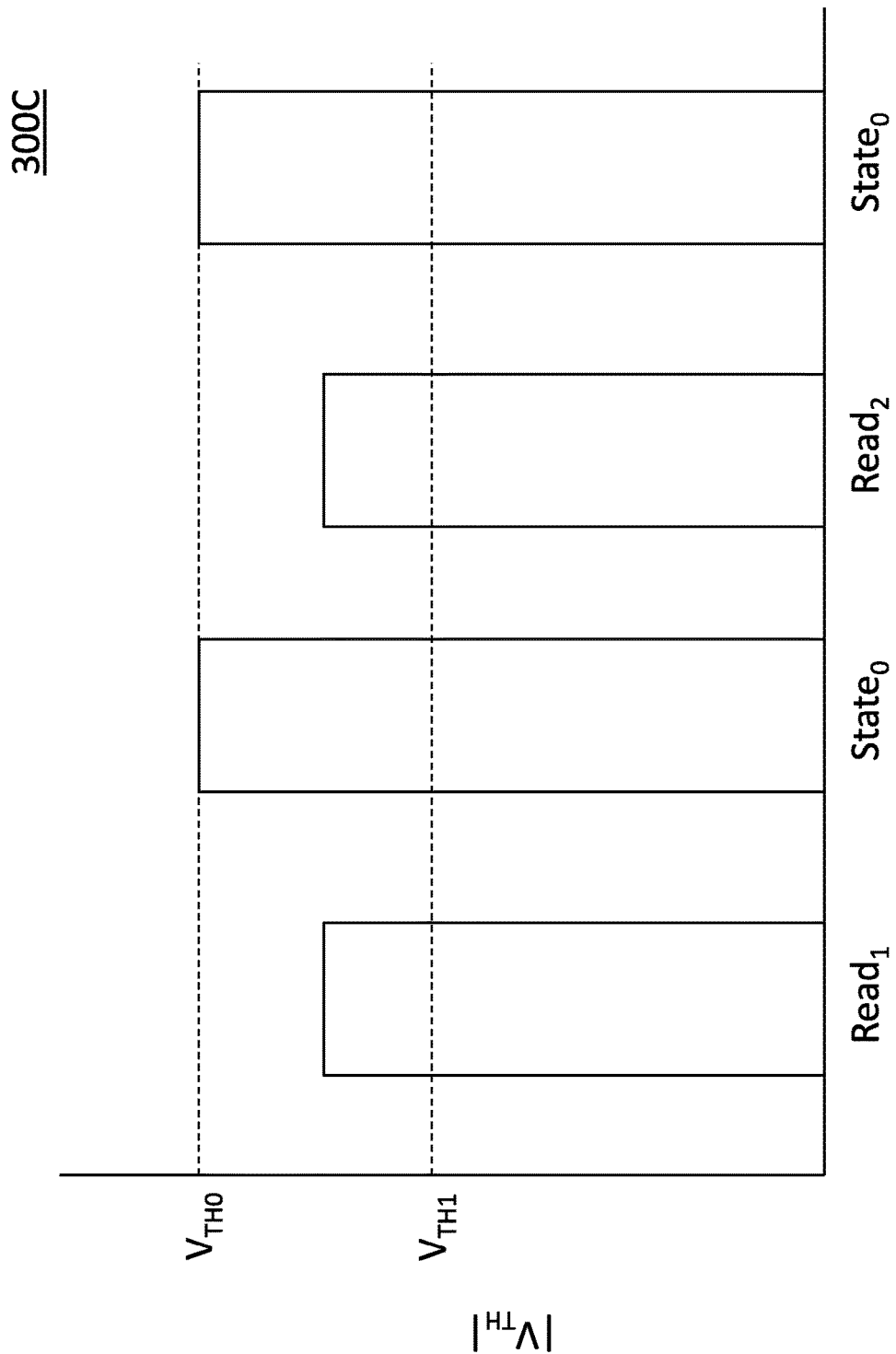
FIG. 3C is a voltage plot of threshold voltages and read pulse voltages according to an embodiment of the disclosure.

FIGS. 3A-C are voltage plots of threshold voltages of memory cells when read by read pulses according to embodiments of the disclosure. In some embodiments, the memory cells may be implemented using the memory cell 115 illustrated in FIG. 1. A read pulse may be a voltage applied to the memory cell for a period of time (e.g., 10 ns-50 ns). The read pulse may be applied by providing a first voltage to a bit line and providing a second voltage to a corresponding word line. In some embodiments, the read pulses may always be applied with the same polarity (e.g., all read pulses exhibit forward polarity, all read pulses exhibit reverse polarity).

FIG. 3A is a voltage plot 300A of threshold voltages of a memory cell in State$_1$ according to an embodiment of the disclosure. FIG. 3A illustrates two read pulses applied to the memory cell in State$_1$. A first read pulse Read$_1$ may be applied to the memory cell. The memory cell may have been written to with a write pulse that has the same polarity as the polarity of Read$_1$. Read$_1$ may have a voltage greater than the threshold voltage of the memory cell in State$_1$. When Read$_1$ is applied, the memory cell exhibits threshold voltage $V_{TH1}$, corresponding to State$_1$. A second read pulse Read$_2$ may be applied to the memory cell. Read$_2$ has the same polarity as Read$_1$. When Read$_2$ is applied, the memory cell exhibits threshold voltage $V_{TH1}$, corresponding to State$_1$. The memory cell in State$_1$ may exhibit the threshold voltage $V_{TH1}$ independent of the number of times it is read when the read pulse has the same polarity as the polarity in which the memory cell was written (e.g., written in forward polarity, read in forward polarity or written in reverse polarity, read in reverse polarity). That is, reading a memory cell in State$_1$ may not be destructive, even if the magnitude of the read pulse exceeds the threshold voltage $V_{TH1}$. Similarly, although not shown in FIG. 3A, when the magnitude of Read$_1$ and/or Read$_2$ is higher than $V_{TH1}$ but lower than $V_{TH0}$, the memory cell exhibit threshold voltage $V_{TH1}$ for each read pulse.

FIG. 3B is a voltage plot 300B of threshold voltages of a memory cell in State$_0$ according to an embodiment of the disclosure. FIG. 3B illustrates two read pulses applied to the memory cell in State$_0$. A first read pulse Read$_1$ may be applied to the memory cell. The memory cell may have been written to with a write pulse that has the opposite polarity as the polarity of Read$_1$ (e.g., written in reverse polarity, read in forward polarity or written in forward polarity, read in reverse polarity). Read$_1$ may have a voltage greater than the threshold voltage of the memory cell in State$_0$. When Read$_1$ is applied, the memory cell exhibits threshold voltage $V_{TH0}$, corresponding to State$_0$. A second read pulse Read$_2$ may be applied to the memory cell subsequent to read pulse Read$_1$. Read$_2$ has the same polarity as Read$_1$. When Read$_2$ is applied, the memory cell exhibits threshold voltage $V_{TH1}$, corresponding to State$_1$.

As shown in FIG. 3B, when the memory cell in State$_0$ is read by a read pulse (Read$_1$) in the opposite polarity having a voltage with a magnitude equal to or greater than $V_{TH0}$, the memory cell may be rewritten to State$_1$. The memory cell will exhibit $V_{TH1}$ during a subsequent read (Read$_2$). That is, when the read pulse has a voltage greater than or equal to $V_{TH0}$ of a memory cell previously written in the opposite polarity as the read pulse, the read may be destructive for cells in State$_0$. After a first read pulse, the memory cell may be rewritten to restore the logic state of the memory cell for a future read operation.

FIG. 3C is a voltage plot 300C of threshold voltages of a memory cell in State$_0$ according to an embodiment of the disclosure. FIG. 3C illustrates two read pulses applied to the memory cell in State$_0$. A first read pulse Read$_1$ may be applied to the memory cell. The memory cell may have been written to with a write pulse in the opposite polarity as the polarity of Read$_1$. Read$_1$ may have a voltage less than the threshold voltage of the memory cell in State$_0$. When Read$_1$ is applied, the memory cell exhibits threshold voltage $V_{TH0}$, corresponding to State$_0$. However, the memory cell does not threshold. A second read pulse Read$_2$ may be applied to the memory cell. Read$_2$ has the same polarity as Read$_1$. When Read$_2$ is applied, the memory cell exhibits threshold voltage $V_{TH0}$, corresponding to State$_0$, and similar to when Read$_1$ was applied, the memory cell does not threshold.

As shown in FIG. 3C, when the memory cell in State$_0$ is read by a read pulse (Read$_1$) in the opposite polarity having a voltage with a magnitude less than $V_{TH0}$, the memory cell may maintain State$_0$. The memory cell may continue to exhibit $V_{TH0}$ during a subsequent read pulses (e.g., Read$_2$). That is, when the read pulse has a voltage less than $V_{TH0}$, the read pulse may not modify the logic state of the cell. As shown in FIG. 3C, the magnitude of the read pulses Read$_1$ and Read$_2$ may be selected to be between threshold voltages $V_{TH0}$ and $V_{TH1}$.

As shown in FIGS. 3A-C, a read pulse may or may not affect the logic state of a memory cell, based at least in part, on the magnitude of the voltage of the read pulse and the logic state of the memory cell. A voltage magnitude of the read pulse may be selected based on the desired effect of the read pulse on the memory cell (e.g., less than $V_{TH0}$ for non-destructive read, greater than $V_{TH0}$ for destructive read).

FIG. 4 is a voltage plot 400 of two write pulses 405, 410 according to an embodiment of the disclosure. The write pulses 405, 410 may be used to write a logic state to a memory cell, such as memory cell 115 shown in FIG. 1, during a write operation. The write pulses may be applied by providing a first voltage to the BL and providing a second voltage to the WL. The resulting voltage applied to the memory cell is the difference between the first and second voltages. The write pulses may be the same duration as read pulses. In some embodiments the duration is 10 ns-50 ns. In some embodiments, the duration is 1-100 ns. In some embodiments, the duration is 1 ns-1 µs. Writing to the memory cell may take the same time as reading the memory cell in some embodiments. Although shown as square pulses in FIG. 4, write pulses of other shapes may be implemented. Other suitable write pulse shapes include, but are not limited to, triangular, trapezoidal, and/or sinusoidal. In some embodiments, write pulses may include leading and/or trailing edges.

In contrast to the read pulses described in reference to FIGS. 3A-C, the polarity of the write pulses may be either a first polarity or a second polarity (e.g., forward or reverse). Write pulse 405 may apply a voltage $V_{W1}$ to a memory cell in a first polarity (e.g., bit line at 6V and word line at 0V). The polarity of the write pulse 405 may be the same as the polarity of read pulses. This may write a first logic state (State$_1$) to the memory cell. As shown in FIG. 2, when write pulse 405 writes State$_1$ to the memory cell, the memory cell exhibits threshold voltage $V_{TH1}$ when read.

Write pulse 410 may apply a voltage $V_{W0}$ to the memory cell in a second polarity (e.g., bit line at −6V and word line at 0V or bit line at 0V and word line at 6V). Write pulse 410 may have the opposite polarity of write pulse 405 and read pulses, such as the read pulses illustrated in FIGS. 3A-C. Write pulse 410 may write a second logic state (State$_0$) to the memory cell. As shown in FIG. 2, when write pulse 410 writes State$_0$ to the memory cell, the memory cell exhibits threshold voltage $V_{TH0}$ when read.

In some embodiments $V_{W0}$ and $V_{W1}$ may have the same voltage magnitude. In some embodiments, $V_{W0}$ and $V_{W1}$ may have different magnitudes. The magnitudes of $V_{W0}$ and $V_{W1}$ may be selected to be greater than or equal to the greater of threshold voltages $V_{TH0}$ and $V_{TH1}$ of State$_0$ and State$_1$, respectively. For example, $|V_{W0}|=|V_{W1}|=6V$, $V_{TH1}=4.5V$, and $V_{TH0}=5.5V$. In some embodiments, the write pulses may have the same magnitude as read pulses. In some embodiments, the write pulses may have greater magnitudes than the read pulses.

As illustrated in FIGS. 2-4, the observed threshold voltage of a memory cell during a read operation may be set to different threshold voltages based, at least in part, on the polarity of the voltage applied to write to the memory cell and the polarity of the voltage applied subsequently to read the memory cell. The different threshold voltages may be used to correspond to different logic states. In some embodiments, the memory cell may act as a two-terminal threshold switching type device. That is, below the threshold voltage, the device is 'off' and conducts little or no current. Above the threshold voltage, the device is 'on' and conducts a current and/or a current above a threshold current. The different threshold voltages, which result from reading and writing with particular pulse polarities may allow the memory cell to act as both a selector device and a memory element. This may facilitate the use of memory arrays having less complex architectures. For example, separate selector and memory layers separated by an additional electrode layer may be avoided when fabricating the memory cells of a memory array. In some embodiments, the memory array may be a cross point memory array. In some embodiments, the memory array may have a three-dimensional cross-point architecture.

A variety of writing and reading protocols may be used with a memory cell having the threshold voltage properties as described in reference to FIGS. 2-4.

Figure 5:
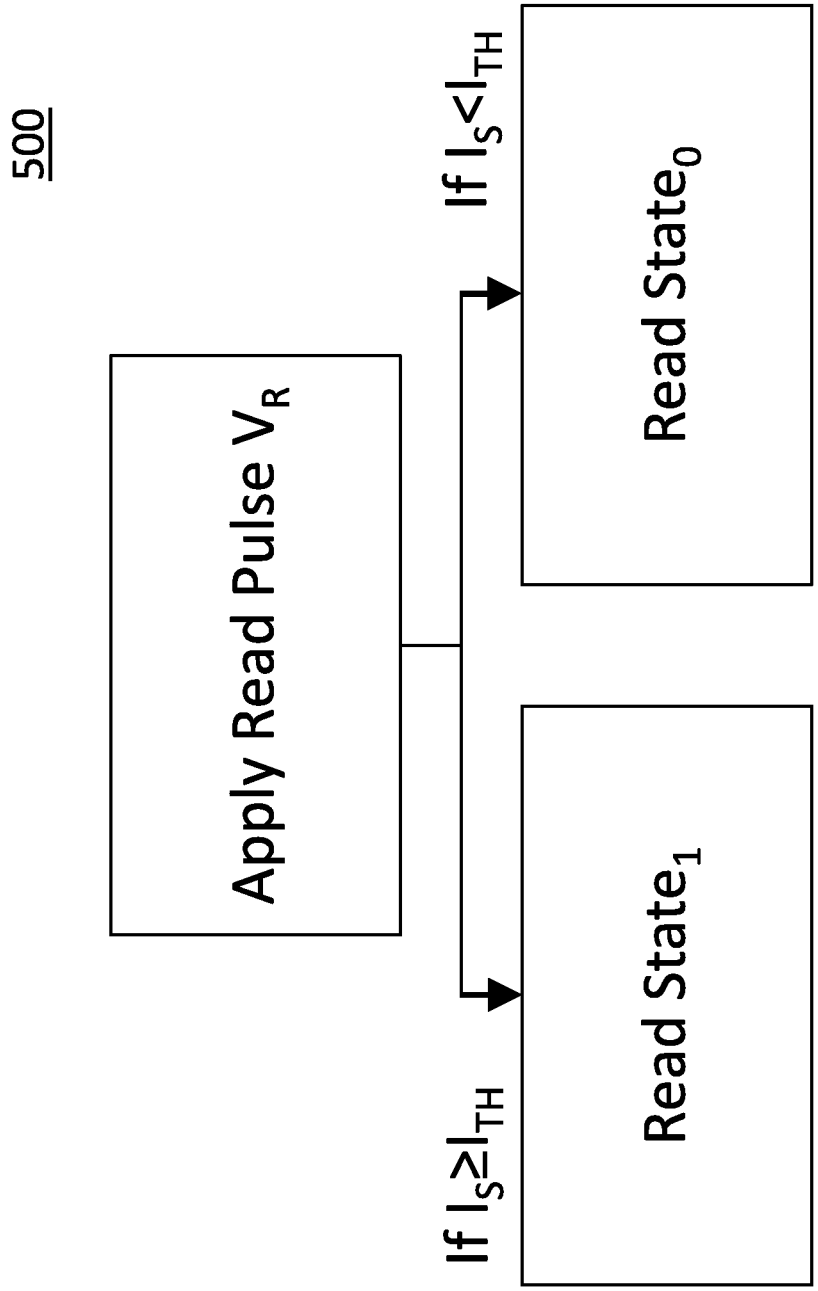
FIG. 5 is a flow chart of a method according to an embodiment of the disclosure.

FIG. 5 is a flow chart of a method 500 for reading a memory cell according to an embodiment of the disclosure. In some embodiments, the memory cell may be implemented by memory cell 115 shown in FIG. 1. The memory cell may exhibit the threshold voltage characteristics illustrated in FIGS. 2-4.

A read pulse of voltage $V_R$ may be applied to the memory cell. The read pulse may be the same polarity each time the read pulse is applied. In FIG. 5, the read pulse may have the same polarity as a write pulse used to write logic State$_1$ to a memory cell. The voltage $V_R$ of the read pulse may be selected to be between the threshold voltage $V_{TH1}$ of State$_1$ and the threshold voltage $V_{TH0}$ of State$_0$ (e.g., $V_{TH1} \leq V_R < V_{TH0}$). In some embodiments, $V_R=5V$, $V_{TH1}=4.5V$, and $V_{TH0}=5.5V$. In other words, $V_R$ may be high enough to threshold a memory cell in State$_1$, but too low to threshold a memory cell in State$_0$.

A sense amplifier coupled to a bit line associated with the read memory cell may be used to detect a current through the memory cell. The sense amplifier may be configured to sense the current through the memory cell responsive to the read operation and provide an output signal indicative of the logic state stored by the memory cell. The sense amplifier may be included in a memory that includes the memory cell. For example, the sense amplifier may be included with other read and write circuits, decoding circuits, register circuits, etc. of the memory that may be coupled to a memory array.

When a read pulse is applied to a memory cell in $State_1$, the memory cell conducts current due to the read pulse exceeding the threshold voltage of the memory cell. The sense amplifier may detect a current $I_S$ through the memory cell. When a read pulse is applied to a memory cell in $State_0$, the memory cell does not conduct current due to the read pulse not exceeding the threshold voltage of the memory cell. The sense amplifier may detect little or no current through the memory cell. A threshold current $I_{TH}$ may be defined for sensing the logic state stored by the memory cell. The threshold current $I_{TH}$ may be set above a current that may pass through the memory cell when the memory cell does not threshold in response to the read pulse, but equal to or below an expected current through the memory cell when the memory cell does threshold in response to the read pulse. That is, the threshold current $I_{TH}$ should be higher than a leakage current of the bit line and/or word line. When sense amplifier detects $I_S \geq I_{TH}$, $State_1$ may be read from the memory cell. When sense amplifier detects $I_S < I_{TH}$, $State_0$ may be read from the memory cell. In some embodiments, a logic state stored by a memory cell may be based on a resulting voltage from the $I_S$ current in response to a read pulse. For example, the resulting voltage may be compared relative to a reference voltage, with a resulting voltage less than the reference voltage corresponding to a first logic state and a resulting voltage greater than the reference voltage corresponding to a second logic state.

The method 500 for reading a memory cell may be non-destructive. That is, the logic state of the memory cell may not need to be rewritten after the memory cell is read. In some embodiments, the logic state of the memory cell may be refreshed at periodic intervals by applying the appropriate write pulse in order to maintain the stored logic states. Refreshing the memory cell may reduce or eliminate read disturb errors. In some embodiments, refreshing the logic state of the memory cell may not be needed.

Figure 6:
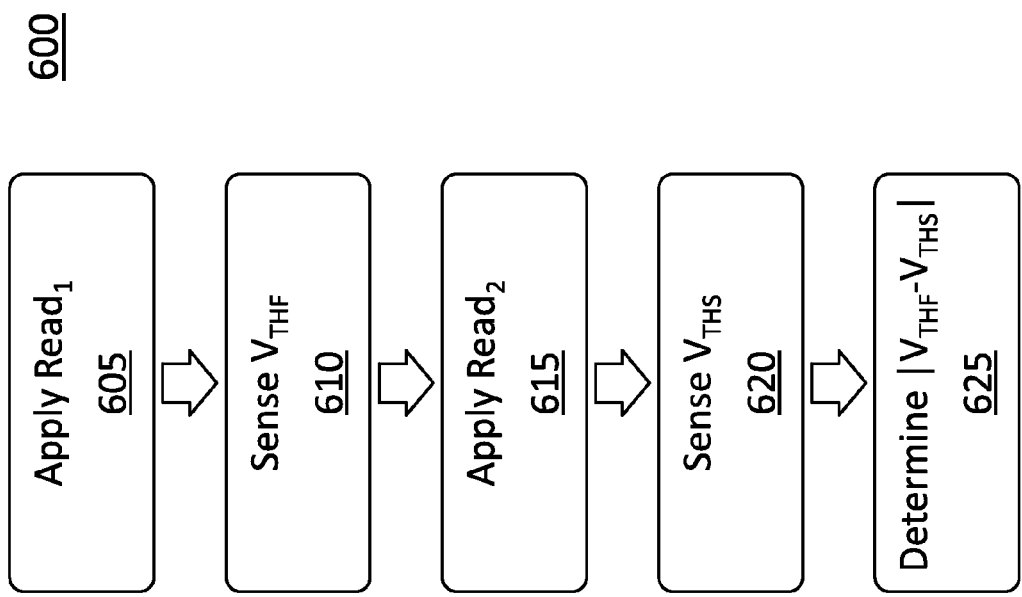
FIG. 6 is a flow chart of a method according to an embodiment of the disclosure.

FIG. 6 is a flow chart of another method 600 for reading a memory cell according to an embodiment of the disclosure. The method 600 may utilize two ramped voltage read pulses $Read_1$, $Read_2$ illustrated in FIG. 7. The read pulses may apply an increasing voltage level up to a maximum voltage of $V_R$. The read pulses may be the same polarity. The read pulses may have the same polarity as a write pulse used to write logic $State_1$ and the opposite polarity as a write pulse used to write logic $State_0$ to a memory cell. The maximum voltage $V_R$ of the read pulses may be selected to be greater than the threshold voltages $V_{TH1}$ of $State_1$ and the threshold voltage $V_{TH0}$ of $State_0$ ($V_{TH1} < V_{TH0} \leq V_R$). For example, in some embodiments $V_R = 6V$, $V_{TH1} = 4.5V$, and $V_{TH0} = 5.5V$. The maximum voltage of the read pulses may be high enough to threshold a memory cell in either logic state.

At Step 605, read pulse $Read_1$ is applied to the memory cell. A first threshold voltage $V_{THF}$ of the memory cell is measured at Step 610. At Step 615, read pulse $Read_2$ is applied to the memory cell, and a second threshold voltage $V_{THS}$ is measured at 620. In some embodiments, the measuring of the threshold voltage of the memory cell may be performed concurrently with the application of the read pulses. For example, as the $Read_e$ pulse ramps to the maximum voltage $V_R$, the voltage at which the memory cell conducts current is determined and represents the first threshold voltage $V_{THF}$. Likewise, as the $Read_2$ pulse ramps to the maximum voltage $V_R$, the voltage at which the memory cell conducts current is determined and represents the second threshold voltage $V_{THS}$.

At Step 625, the difference between $V_{THF}$ and $V_{THS}$ is determined. As described previously, if a memory cell is written with a write pulse having a polarity opposite the read pulse, the memory cell will exhibit a higher threshold voltage when read. However, if the read pulse has a voltage high enough to threshold the memory cell, the memory cell will exhibit a lower threshold voltage during a subsequent read. This property is illustrated in FIG. 3B. Thus, if the difference between $V_{THF}$ and $V_{THS}$ is determined to be above a certain magnitude (e.g., 0.25V, 0.5V), the memory cell was programmed by a write pulse having the opposite polarity as the read pulse (e.g., $State_0$ of FIGS. 2-4). If the difference between $V_{THF}$ and $V_{THS}$ is determined to be negligible, the memory cell was programmed by a write pulse having the same polarity as the read pulse (e.g., $State_1$ of FIGS. 2-4).

In some embodiments, $Read_1$ and $Read_2$ may not ramp all the way to $V_R$. Rather, $Read_1$ and $Read_2$ may ramp only until a respective threshold voltage has been detected.

The method 600 for reading a memory cell may be destructive. That is, the application of $Read_1$ and $Read_2$ change the threshold voltage of the memory cell, and thus, change the logic state of the memory cell. Consequently, the logic state of the memory cell may need to be rewritten after the memory cell is read. For example, a memory cell in $State_0$ may change to $State_1$ during the read operation. The logic state of the memory cell may be rewritten following Step 625.

Figure 7:
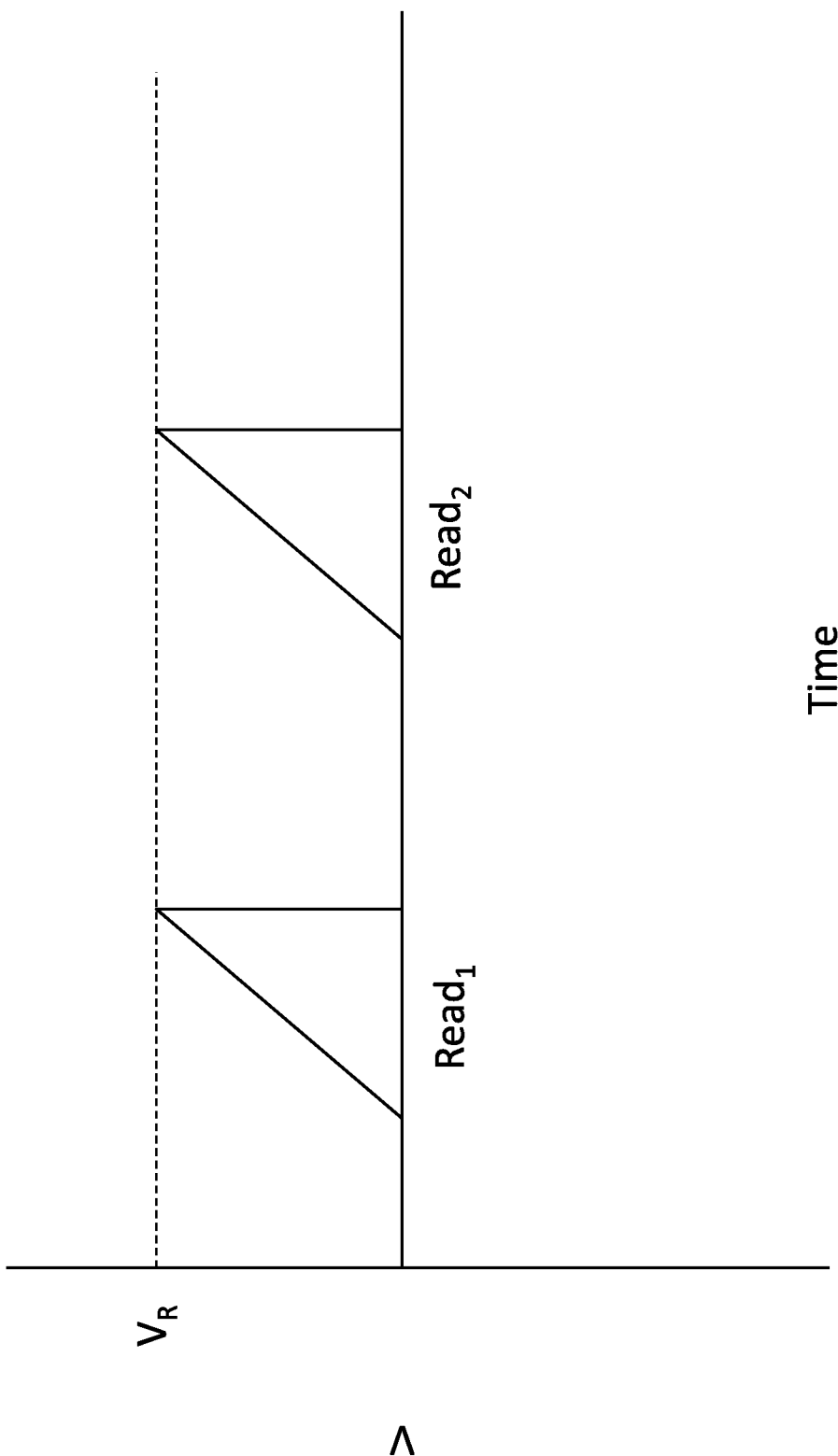
FIG. 7 is a voltage plot of read pulse voltages according to an embodiment of the disclosure.

Although $Read_1$ and $Read_2$ have been described with reference to FIG. 7 as being ramped voltage pulses, in some embodiments the voltage of $Read_1$ and $Read_2$ may be increased non-linearly (e.g., exponentially) without departing from the scope of the disclosure.

In an alternative embodiment not shown in FIG. 6, currents across the memory cell may be sensed for each read pulse, for example, when the memory cell conducts current when the memory cell thresholds, and the difference between the sensed currents for the read pulses may be calculated to determine the logic state of the memory cell. In this alternative embodiment, $V_R$ may be between the threshold voltages of the different logic states, similar to method 500 shown and previously described with reference to FIG. 5. This alternative embodiment may provide a non-destructive read of a memory cell.

Figure 8:
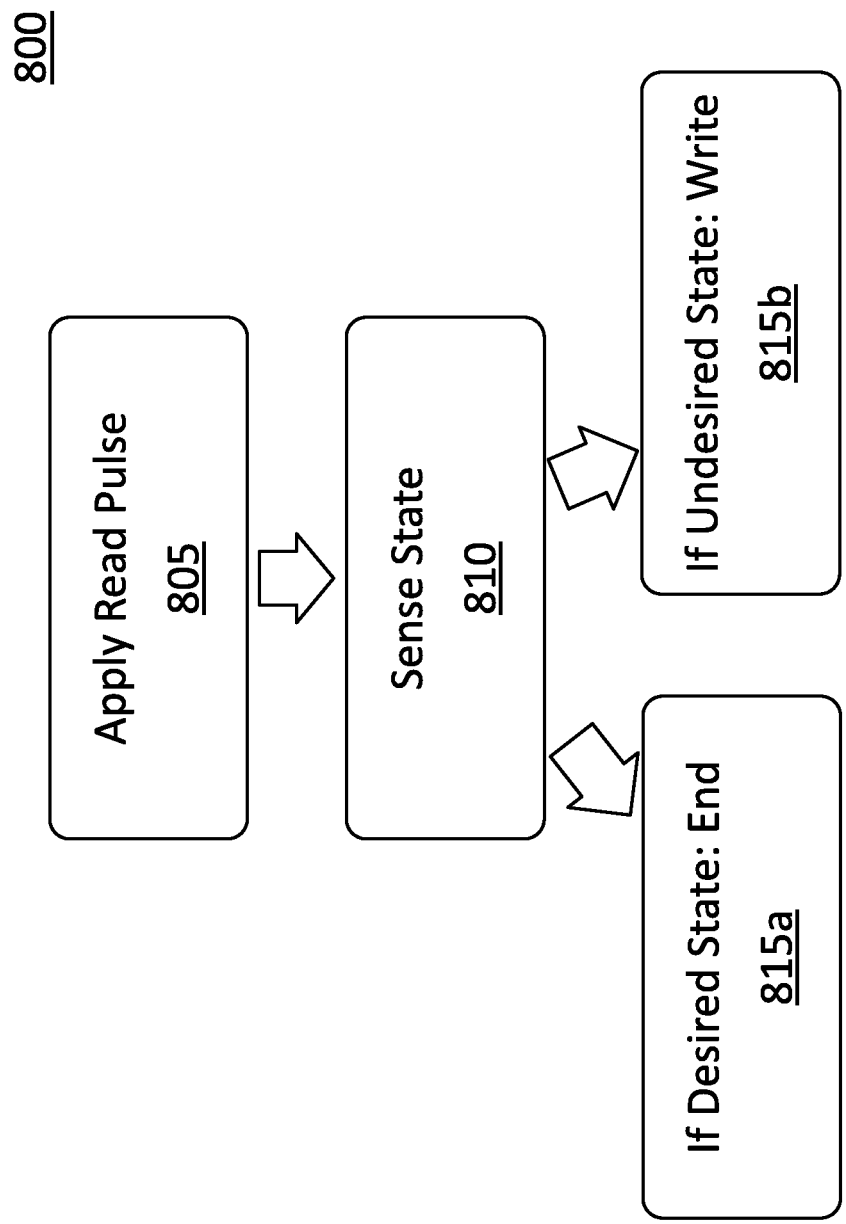
FIG. 8 is a flow chart of a method according to an embodiment of the disclosure.

In some embodiments, a memory cell may be written to by a single write pulse of either a first or a second polarity as previously described in reference to FIG. 4. In some embodiments, a memory cell may be read prior to being written. FIG. 8 is a flow chart of a method 800 of reading a memory cell prior to writing a logic state to the memory cell according to an embodiment of the disclosure.

At Step 805, a read pulse is applied to the memory cell and the logic state of the memory cell is sensed at Step 810. In some embodiments, reading the memory cell at Steps 805 and 810 may be implemented using the method 500 shown in FIG. 5. If the memory cell is currently in the logic state that is to be written, then the method ends at Step 815a. If the memory cell is currently programmed in a different logic state from the logic state that is to be written, then the memory cell is written to at Step 815b. The cell may be written to by applying the appropriate write pulse to write the desired logic state. For example, one of the write pulses illustrated in FIG. 4 may be used to program the memory cell. Reading the memory cell prior to writing may reduce the number of higher voltage pulses that are required during operation of a memory array when the voltage of a write pulse is greater than the voltage of a read pulse (e.g., 6V vs. 5V).

Other writing and reading protocols and/or modifications to the protocols described herein may be used without departing from the principles of the disclosure. For example, in some methods, sensing currents and/or voltages may be limited to a specific time period. The time period may be from the initiation of a read pulse to a point in time after the initiation of the read pulse (e.g., 20 ns). In some embodiments, a memory cell may be read in a forward polarity and written in either the forward or reverse polarity. In some embodiments, the memory cell may be read in a reverse polarity and written in either the forward or reverse polarity.

In some embodiments, the chalcogenide material of the memory cell may exhibit a greater difference between threshold voltages of two logic states when read in a reverse polarity. In some embodiments, the chalcogenide material of the memory cell may exhibit a greater difference between threshold voltages of two logic states when read in a forward polarity. The polarity of the read pulses may be selected to provide the greatest difference between threshold voltages.

Figure 9:
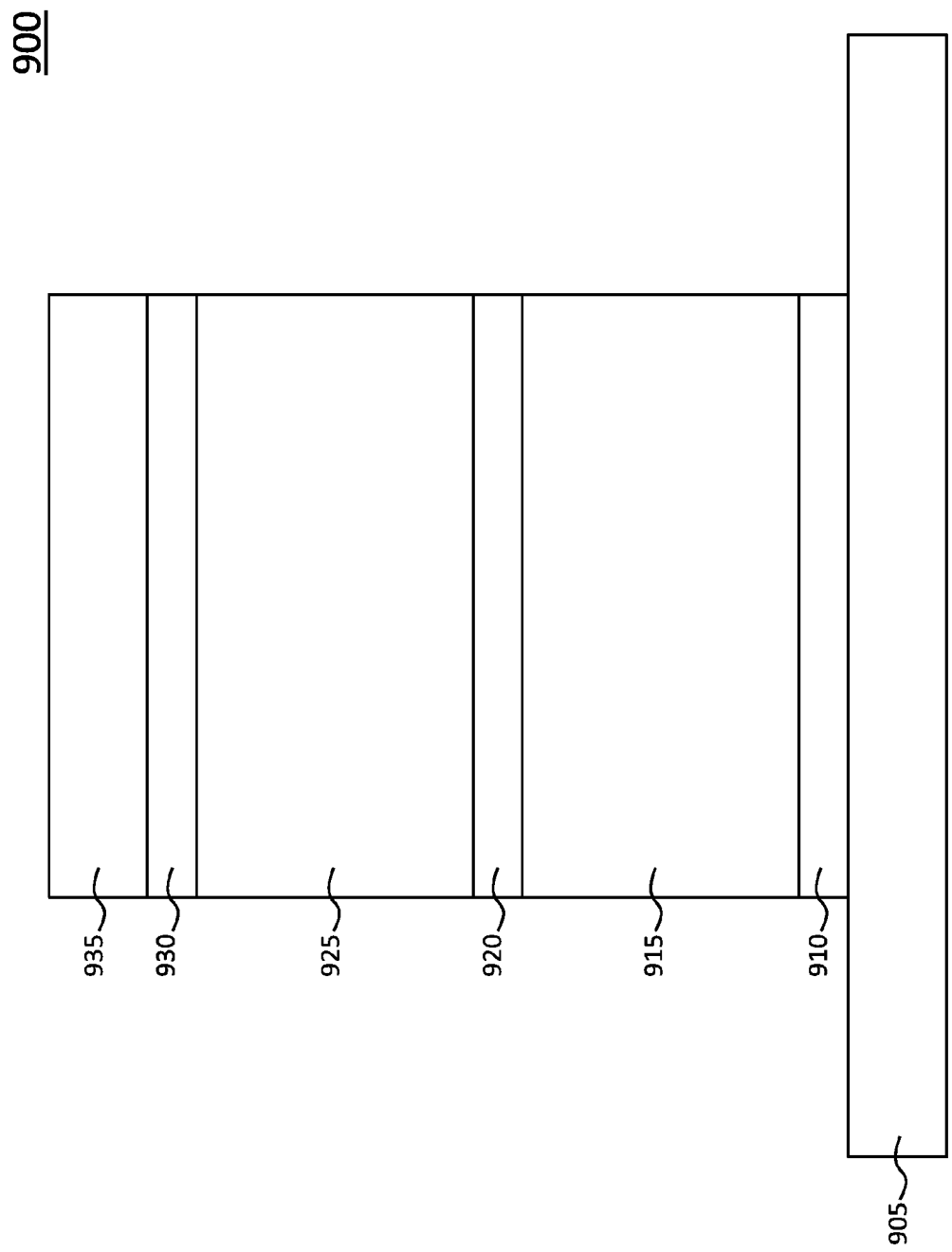
FIG. 9 is an illustration of a portion of a phase change memory array.

FIG. 9 is an illustration of a portion of a conventional memory array 900. The memory array 900 may include a word line (WL) 905 and a bit line (BL) 935. As shown in FIG. 9, the WL 905 extends parallel to the plane of the page, and the BL 935 extends into the plane of the page, perpendicular to the WL 905. A selector device 915 may be located at an intersection of the WL 905 and the BL 935. The selector device 915 may be coupled to WL 905 by a first electrode 910 and coupled to a second electrode 920. The electrode 920 may couple the selector device 915 to a memory element 925. The memory element 925 may be coupled to BL 935 by a third electrode 930. The memory element 925 may include a layer of chalcogenide material. In some embodiments, the chalcogenide material may be a phase change material, but other materials may be used. In some embodiments, the selector device 915 may also include a layer of chalcogenide material. Other materials may also be used.

Figure 10:
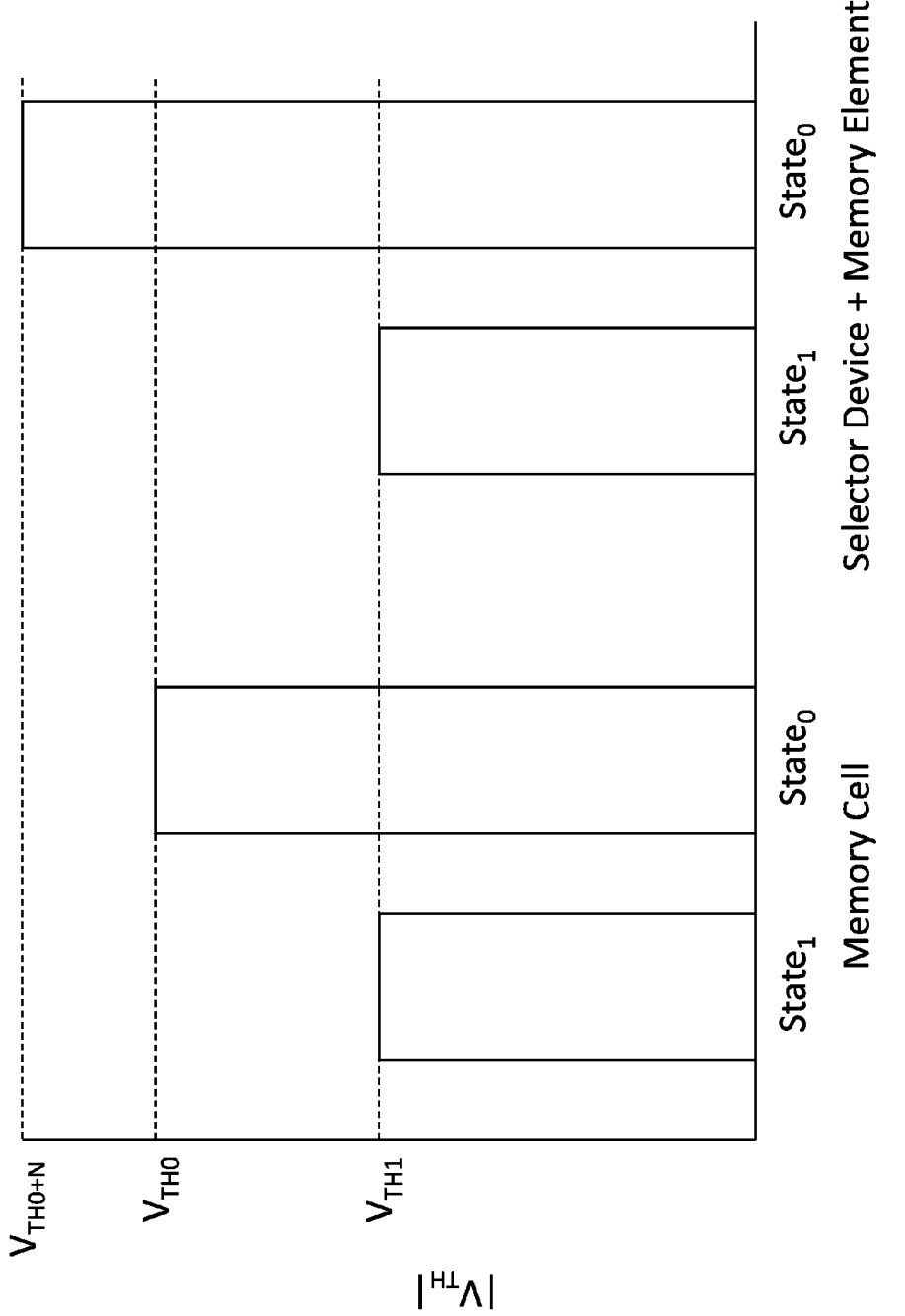
FIG. 10 is a voltage plot of threshold voltages according to an embodiment of the disclosure.

In an alternative embodiment of the disclosure, the protocols for reading and writing a memory cell with different voltage polarities as described in reference to FIGS. 4-8 may be applied to a selector device and memory element of a memory array, for example, selector device 915 and memory element 925 shown in FIG. 9. Similar to memory cell 115 illustrated in FIG. 1, the selector device and memory element may be written to two or more logic stages represented by different threshold voltages as shown in FIG. 2. The threshold voltage effects of the different read and write polarities may be additive across the selector device and the memory element. As shown in the voltage plot of FIG. 10, a difference between the threshold voltages of different logic states for the selector device and memory element may be greater than the difference between threshold voltages of different logic states of a memory cell. That is, $|V_{TH0}-V_{TH1}| < |V_{TH0+N}-V_{TH1}|$ where $V_{TH0+N}$ is the voltage $V_{TH0}$ summed with the additional difference in magnitude between threshold voltages of the different logic states due to the additive effect of the selector device and memory element. This larger difference between threshold voltages may provide a wider margin for detecting different logic states. Although $State_1$ is shown in FIG. 10 as having the same threshold voltage $V_{TH1}$ for both the memory cell and the selector device and memory element, the threshold voltage for $State_1$ for the memory cell may be different from the threshold voltage for $State_1$ of the selector device and memory element in some embodiments.

Figure 11:
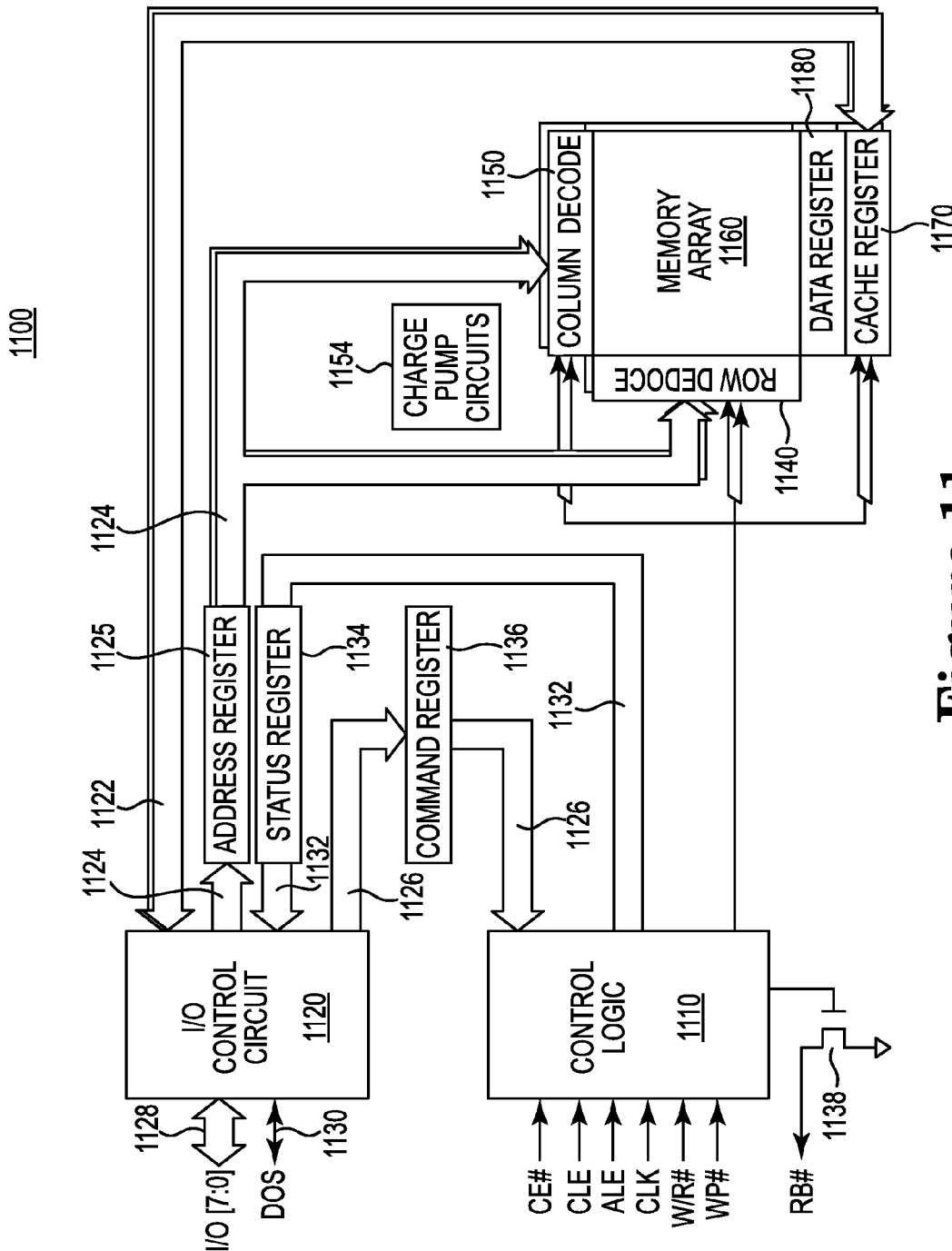
FIG. 11 is a block diagram of a memory according an embodiment of the disclosure.

FIG. 11 illustrates a memory 1100 according to an embodiment of the disclosure. The memory 1100 includes a memory array 1160 with a plurality of memory cells that are configured to store data. The memory cells may be accessed in the array through the use of various signal lines, word lines (WLs) and bit lines (BLs). The memory cells may be non-volatile memory cells, such as phase change memory cells, or may generally be any type of memory cells. The memory cells may be single level cells configured to store data for one bit of data. The memory cells may also be multi-level cells configured to store data for more than one bit of data.

Commands, address information, and write data may be provided to the memory 1100 as sets of sequential input/output (I/O) transmitted through an I/O bus 1128. Similarly, read data may be provided from the memory 100 through the I/O bus 1128. A data strobe signal DQS may be transmitted through a data strobe bus 130. The DQS signal may be used to provide timing information for the transfer of data to the memory or from the memory. The I/O bus 1128 is connected to an I/O control circuit 1120 that routes data signals, address information signals, and other signals between the I/O bus 1128 and an internal data bus 1122, an internal address bus 1124, and an internal command bus 1126. An address register 1125 may be provided address information by the I/O control circuit 1120 to be temporarily stored. The I/O control circuit 1120 is coupled to a status register 1134 through a status register bus 1132. Status bits stored by the status register 1134 may be provided by the I/O control circuit 1120 responsive to a read status command provided to the memory 1100. The status bits may have respective values to indicate a status condition of various aspects of the memory and its operation.

The memory 1100 also includes a control logic 1110 that receives a number of control signals either externally (e.g., CE#, CLE, ALE, CLK, W/R#, and WP#) or through the command bus 1126 to control the operation of the memory 1100. A command register 1136 is coupled to the internal command bus 1126 to store information received by the I/O control circuit 1120 and provide the information to the control logic 1110. The control logic 1110 may further access a status register 134 through the status register bus 1132, for example, to update the status bits as status conditions change. The control logic 1110 is further coupled to a ready/busy circuit 1138 to control a value (e.g., logic value) of a ready/busy signal R/B# that may be provided by the memory 1100 to indicate whether the memory is ready for an operation or is busy. The control logic 1110 may be configured to provide internal control signals to various circuits of the memory 1100. For example, responsive to receiving a memory access command (e.g., read, write, program), the control logic 1110 may provide internal control signals to control various memory access circuits to perform a memory access operation. The various memory access circuits are used during the memory access operation, and may generally include circuits such as row and column decoders, signal line drivers, data 1180 and cache registers 1170, I/O circuits, as well as others.

The address register 1125 provides block-row address signals to a row decoder 1140 and column address signals to a column decoder 1150. The row decoder 1140 and column decoder 1150 may be used to select blocks of memory cells for memory operations, for example, read, program, and erase operations. The row decoder 1140 and/or the column decoder 1150 may include one or more signal line drivers configured to provide a biasing signal to one or more of the signal lines in the memory array 1160.

In some embodiments, during a write operation on a memory cell of the memory array 1160, a first voltage (e.g., 0V) may be provided to a selected word and a second voltage may be provided to a selected bit line. The memory cell may be at the intersection of the selected word line and bit line. The second voltage may be higher or lower than the voltage provided to the word line, based on the logic state to be stored at the address corresponding to the selected word line and bit line (e.g., −6V for '1' and +6V for '0'). In some embodiments, during a write operation, the selected bit line may always be provided a specific voltage, and the word line may be provided a voltage higher or lower than the voltage of the bit line, based on the logic state to be stored at the address.

In some embodiments, during a read operation on a memory cell, a first voltage (e.g., 0V) may be provided to a selected word line and a second voltage (e.g., −5V, +5V) may be provided to a selected bit line. The memory cell may be at the intersection of the selected word line and bit line. The second voltage may be greater than or less than the first voltage provided to the word line, however, the second voltage may provide the same voltage polarity for every read operation. The logic state of the memory cell may be sensed by a sense amplifier coupled to the selected bit line. The sensed logic state of the memory cell may be provided to the data register 180.

Figure 12:
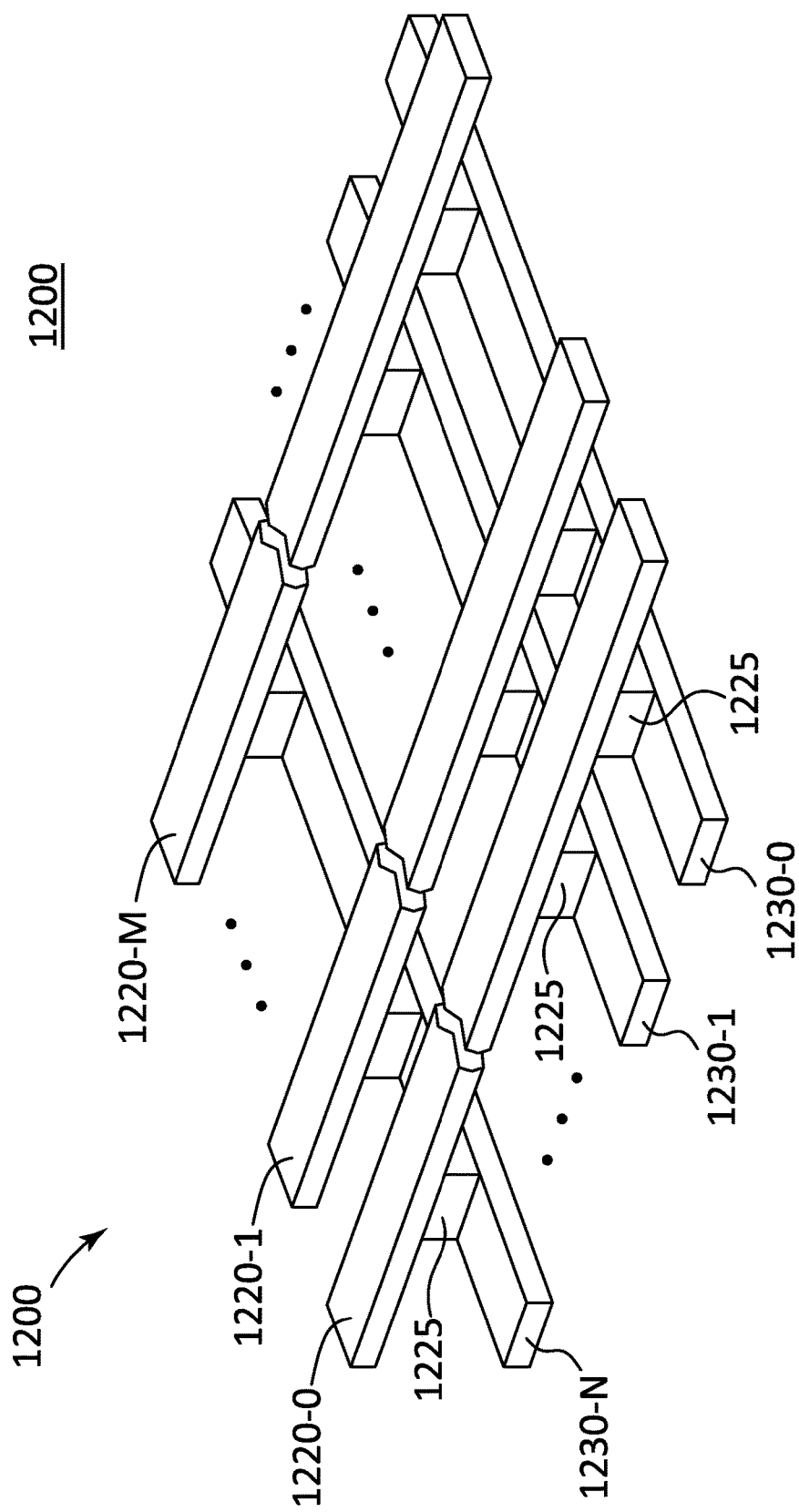
FIG. 12 is a schematic illustration of a portion of a memory array according to an embodiment of the disclosure.

FIG. 12 is a diagram illustrating a portion of an array 1200 of memory cells according to an embodiment of the disclosure. The array 1200 may be used to implement the memory array 1160 of FIG. 11 in some embodiments. In the example illustrated in FIG. 12, the array 1200 is a cross-point array including a first number of conductive lines 1230-0, 1230-1, . . . , 1230-N, e.g., access lines, which may be referred to herein as word lines, and a second number of conductive lines 1220-0, 1220-1, . . . , 1220-M, e.g., access lines, which may be referred to herein as bit lines. A memory cell 1225 is located at each of the intersections of the word lines 1230-0, 1230-1, . . . , 1230-N and bit lines 1220-0, 1220-1, . . . , 1220-M and the memory cells 1225 can function in a two-terminal architecture, e.g., with a particular word line 1230-0, 1230-1, . . . , 1230-N and bit line 1220-0, 1220-1, . . . , 1220-M serving as the electrodes for the memory cells 1225.

The memory cells 1225 can be resistance variable memory cells, e.g., RRAM cells, CBRAM cells, PCRAM cells, and/or STT-RAM cells, among other types of memory cells. The memory cell 1225 can include a material programmable to different data states (e.g., chalcogenide). For instance, the memory cell 1225 may be written to store particular levels corresponding to particular data states responsive to applied writing voltage and/or current pulses, for instance. Embodiments are not limited to a particular material or materials. For instance, the material can be a chalcogenide formed of various doped or undoped materials. Other examples of materials that can be used to form storage elements include binary metal oxide materials, colossal magnetoresistive materials, and/or various polymer based resistance variable materials, among others.

In operation, the memory cells 1225 of array 1200 can be written to by applying a voltage, e.g., a write voltage, across the memory cells 1225 via selected word lines 1230-0, 1230-1, . . . , 1230-N and bit lines 1220-0, 1220-1, . . . , 1220-M. A sensing, e.g., read, operation can be used to determine the data state of a memory cell 1225 by sensing current, for example, on a bit line 1220-0, 1220-1, . . . , 1220-M corresponding to the respective memory cell responsive to a particular voltage applied to the selected word line 1230-0, 1230-1, . . . , 1230-N to which the respective cell is coupled.

Figure 13:
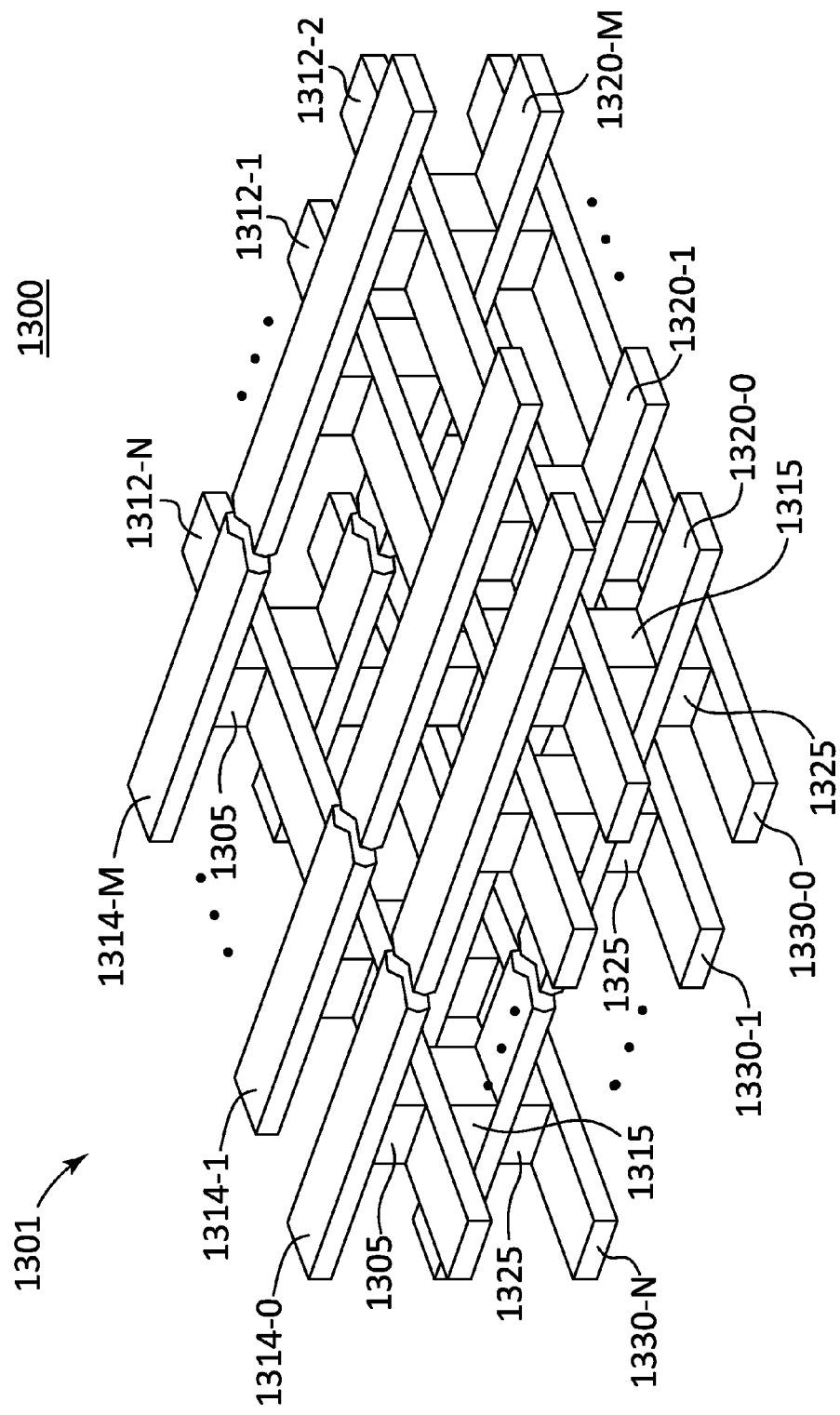
FIG. 13 is a schematic illustration of a portion of a memory array according to an embodiment of the disclosure.

FIG. 13 is a diagram illustrating a portion of an array 1300 of memory cells. The array 1300 may be used to implement the memory array 1160 of FIG. 11 in some embodiments. In the example illustrated in FIG. 13, the array 1300 is configured in a cross-point memory array architecture, e.g., a three-dimensional (3D) cross-point memory array architecture. The multi-deck cross-point memory array 1300 includes a number of successive memory cells, e.g., 1305, 1315, 1325 disposed between alternating, e.g., interleaved, decks of word lines, e.g., 1330-0, 1330-1, . . . , 1330-N and 1312-0, 1312-1, . . . , 1312-N extending in a first direction and bit lines, e.g., 1320-0, 1320-1, . . . , 1320-M and 1314-0, 1314-1, . . . , 1314-M extending in a second direction. The number of decks can be expanded in number or can be reduced in number, for example. Each of the memory cells 1305, 1325 can be configured between word lines, e.g., 1330-0, 1330-1, . . . , 1330-N and 1312-0, 1312-1, . . . , 1312-N and bit lines, e.g., 1320-0, 1320-1, . . . , 1320-M and 1314-0, 1314-1, . . . , 1314-M, such that a single memory cell 1305, 1325 is directly electrically coupled with and is electrically in series with its respective bit line and word line. For example, array 1300 can include a three-dimensional matrix of individually-addressable, e.g., randomly accessible, memory cells that can be accessed for data operations, e.g., sense and write, at a granularity as small as a single storage element or multiple storage elements. In a number of embodiments, memory array 1300 can include more or less bit lines, word lines, and/or memory cells than shown in the examples in FIG. 13.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims

What is claimed is:

1. A method, comprising:
   applying a read pulse having a first polarity to a memory cell, wherein a first or a second logic state is written to the memory cell, wherein the first logic state is written responsive to a write pulse having the first polarity and the second logic state is written responsive to the write pulse having a second polarity, wherein the read pulse has a magnitude less than a magnitude of the write pulse;
   sensing a current through the memory cell responsive to the read pulse; and
   determining the memory cell is in the first or second logic state, based on the current through the memory cell,
   wherein the memory cell is determined to be in the second logic state if the current through the memory cell is below a threshold current and the memory cell is determined to be in the first logic state if the current through the memory cell is equal to or above the threshold current, and
   wherein the magnitude of the read pulse is between a magnitude of a first threshold voltage of the memory cell causing the current that is equal to or above the threshold current and a magnitude of a second threshold voltage of the memory cell which causes the current that is below the threshold current.

2. The method of claim 1, wherein the current is sensed with a sense amplifier.

3. The method of claim 1, wherein a duration of the read and write pulses is between 1 nanosecond and 1 microsecond.

4. The method of claim 1, further comprising writing a desired logic state to the memory cell with the write pulse having the first polarity or the second polarity when the logic state of the memory cell is determined to be in an undesired logic state.

5. The method of claim 1, wherein applying the read pulse to the memory cell is destructive to the first or second logic state.

6. The method of claim 1, further comprising providing a negative voltage to a first memory access line coupled to the memory cell and providing a positive voltage to a second memory access line coupled to the memory cell to provide the write pulse having the first polarity.

7. The method of claim 1, further comprising providing a first non-negative voltage to a first memory access line coupled to the memory cell and providing a second non-negative voltage to a second memory access line coupled to the memory cell to provide the write pulse having the first polarity, wherein the second non-negative voltage is greater than the first non-negative voltage.

8. A method, comprising:
applying a first read pulse having a first polarity to a memory cell, wherein the memory cell was programmed to a logic state with a write pulse having the first polarity or a second polarity;
sensing a first threshold voltage of the memory cell responsive to the first read pulse;
applying a second read pulse having the first polarity to the memory cell;
sensing a second threshold voltage of the memory cell responsive to the second read pulse;
calculating a difference between the first threshold voltage and the second threshold voltage; and
determining the logic state of the memory cell, wherein the logic state is determined to be a first state when the difference is below a threshold value and the logic state is determined to be a second state when the difference is above the threshold value.

9. The method of claim 8, wherein the first and second read pulses are ramped voltage pulses.

10. The method of claim 9, wherein a voltage of the ramped voltage pulses is increased linearly.

11. The method of claim 9, wherein a voltage of the ramped voltage pulses is increased non-linearly.

12. The method of claim 9, further comprising reprogramming the memory cell to the logic state after the second read pulse.

* * * * *

UNITED STATES PATENT AND TRADEMARK OFFICE
CERTIFICATE OF CORRECTION

| | | |
|---|---|---|
| PATENT NO. | : 10,134,470 B2 | Page 1 of 1 |
| APPLICATION NO. | : 14/932746 | |
| DATED | : November 20, 2018 | |
| INVENTOR(S) | : Innocenzo Tortorelli et al. | |

It is certified that error appears in the above-identified patent and that said Letters Patent is hereby corrected as shown below:

In the Claims

| | Reads | Should Read |
|---|---|---|
| Column 14, Line 25 | "The method of claim 9, further comprising reprogramming the memory cell to the logic state after the second read pulse." | -- The method of claim 8, further comprising reprogramming the memory cell to the logic state after the second read pulse. -- |

Signed and Sealed this
Eleventh Day of June, 2019

Andrei Iancu
*Director of the United States Patent and Trademark Office*